Figure 1:
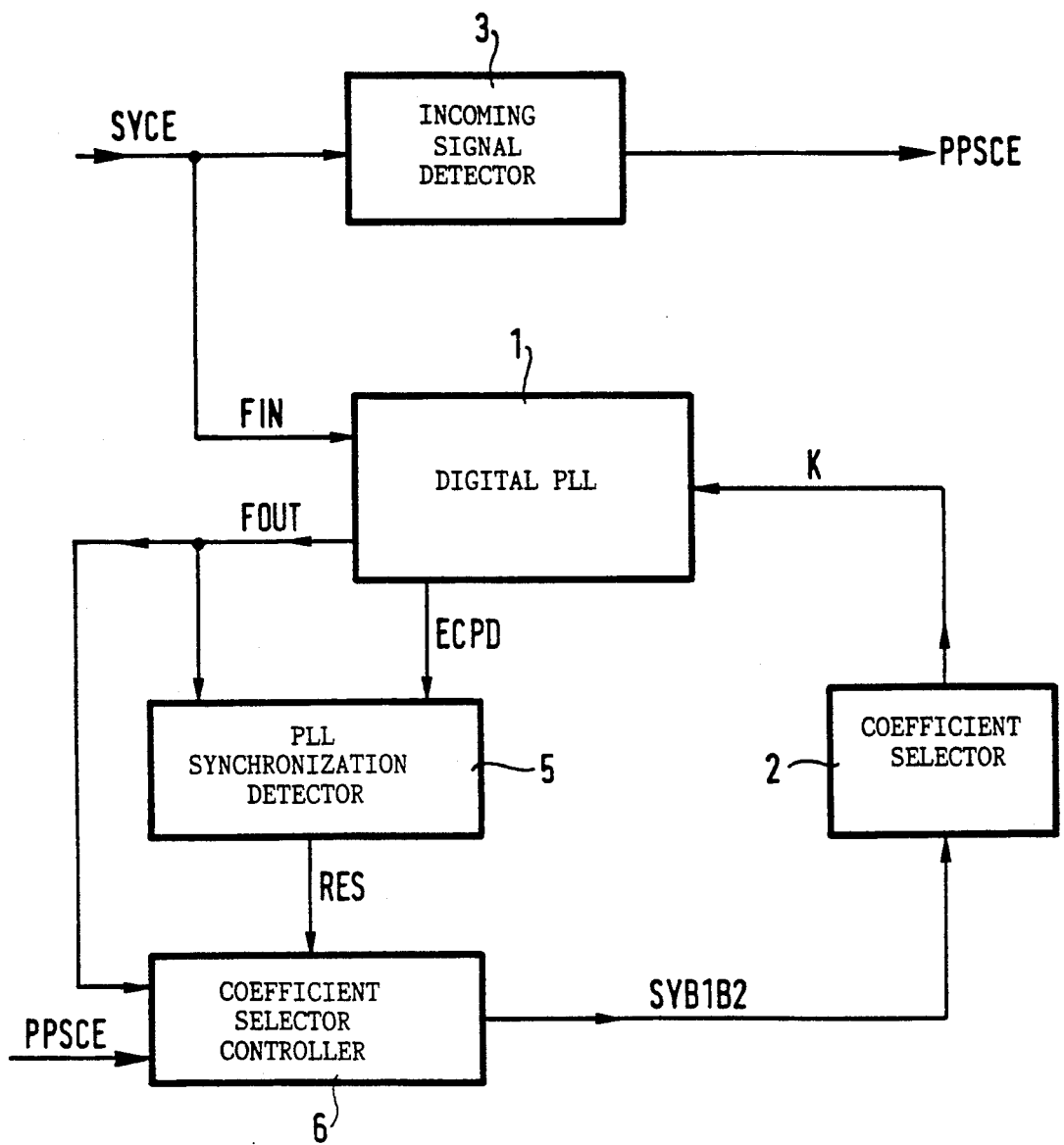

United States Patent [19]

Lafon

[11] Patent Number: 5,268,653
[45] Date of Patent: Dec. 7, 1993

[54] DIGITAL PHASE-LOCKED LOOP OPERATING MODE CONTROL METHOD AND DEVICE

[75] Inventor: Jean-Luc Lafon, Le Perreux sur Marne, France

[73] Assignee: Alcatel Cit, Paris, France

[21] Appl. No.: 955,261

[22] Filed: Oct. 1, 1992

[30] Foreign Application Priority Data

Oct. 4, 1991 [FR] France ................ 91 12265

[51] Int. Cl.⁵ .......................................... H03L 7/095
[52] U.S. Cl. ..................... 331/1 A; 328/155; 331/25; 331/DIG. 2
[58] Field of Search ............. 331/1 A, 25, DIG. 2; 328/155

[56] References Cited

U.S. PATENT DOCUMENTS

| | | | |
|---|---|---|---|
| 3,989,931 | 11/1976 | Phillips | 328/134 |
| 4,316,152 | 2/1982 | Meyer | 331/1 A |
| 4,587,496 | 5/1986 | Wolaver | 331/1 A |
| 4,763,342 | 8/1988 | Ambrosio et al. | 328/155 X |

OTHER PUBLICATIONS

Electronic Components and Applications, vol. 9, No. 2, Dec. 31, 1989, Eindhoven, Netherlands, pp. 66-89; W. Rosink: "All Digital Phase-Locked Loops Using The 74HC/HCT297".

*Primary Examiner*—Siegfried H. Grimm
*Attorney, Agent, or Firm*—Sughrue, Mion, Zinn, Macpeak & Seas

[57] ABSTRACT

A method for controlling the operating mode of a digital phase-locked loop including a counter controlling incrementing or decrementing of the frequency of a digital clock signal internal to the loop is such that, the input signal of the loop being present intermittently, with random phase from one appearance to the next, the control method comprises, in this order, the following steps:

detecting the appearance of the input signal,
    selecting a relatively low capacity of the counter to enable relatively fast synchronization of the loop,
    detecting synchronization of the loop,
    selecting a relatively high capacity of the counter to filter relatively strongly any phase variations of the input signal occurring while it is present, this latter adjustment being retained until the next detection of the appearance of the input signal.

3 Claims, 4 Drawing Sheets

DIGITAL PHASE-LOCKED LOOP OPERATING MODE CONTROL METHOD AND DEVICE

The present invention concerns digital signal processing. It is more particularly concerned with devices known as digital phase-locked loops.

These devices are well known: suffice to say that they are used to slave the phase of an output digital signal supplied by this loop to that of an input digital signal received by this loop and that they operate essentially by incrementing or decrementing the frequency of a clock signal supplied by an oscillator internal to the loop according to the phase difference between said input and output signals.

The signal controlling incrementing or decrementing of the frequency of the clock signal supplied by said oscillator is supplied by the overflow output of a counter which is triggered by a signal representing said phase difference and which is clocked by a clock signal also supplied by said internal oscillator. Phase control by a loop of this kind is therefore accompanied by a greater or lesser degree of low-pass filtering or integration according to the capacity of the counter, which is usually variable by operating on one or more counter control coefficients (depending on whether said loop is of the first order or a higher order).

Filtering may or may not be required, depending on the intended application of the loop, and the loop synchronization time is proportional to the degree of filtering.

The present invention is particularly directed to a type of application in which a short synchronization time is required in conjunction with a high degree of filtering.

The invention applies in particular to synchronizing a telecommunication terminal connected to an asynchronous transfer mode telecommunication network through an adapter so that the terminal sees a synchronous interface, an adapter of this kind using a digital phase-locked loop to generate a clock signal whose mean frequency is equal to the base frequency of said synchronous interface and whose phase is slaved to that of an input clock signal with the same period as that of data received from this network via this adapter.

When a call in which the terminal is involved is set up there is the simultaneous requirement for a relatively short loop synchronization time and a relatively high degree of filtering in order to meet the usually severe conditions imposed by the standards governing this type of interface as to the maximum jitter permissible in said clock signal whose mean frequency is equal to the base frequency of said synchronous interface.

The present invention consists in a method for controlling the operating mode of a digital phase-locked loop comprising a counter controlling incrementing or decrementing of the frequency of a digital clock signal internal to said loop characterized in that, the input signal of said loop being present intermittently, with random phase from one appearance to the next, the control method comprises, in this order, the following steps:
  detecting the appearance of said input signal,
  selecting a relatively low capacity of said counter to enable relatively fast synchronization of said loop,
  detecting synchronization of said loop,
  selecting a relatively high capacity of said counter to filter relatively strongly any phase variations of said input signal occurring while it is present, this latter adjustment being retained until the next detection of the appearance of the input signal.

The invention also consists in a device for implementing this method.

According to another feature of the invention, said phase-locked loop comprising a detector responsive to the phase difference between said input signal and said output signal and the output signal of said phase difference detector having transitions of a first type coincident with transitions of a given type in the output signal and transitions of a second type coincident with transitions of a given type in the input signal, the device for implementing said method comprises means for detecting said synchronization comprising means for sampling the output signal of the phase difference detector on transitions of the output signal which are of the type opposite to said given type, means for storing groups of at least three consecutive samples, and means for detecting the moment at which at least two of said samples have different logical values for the first time.

Figure 2:
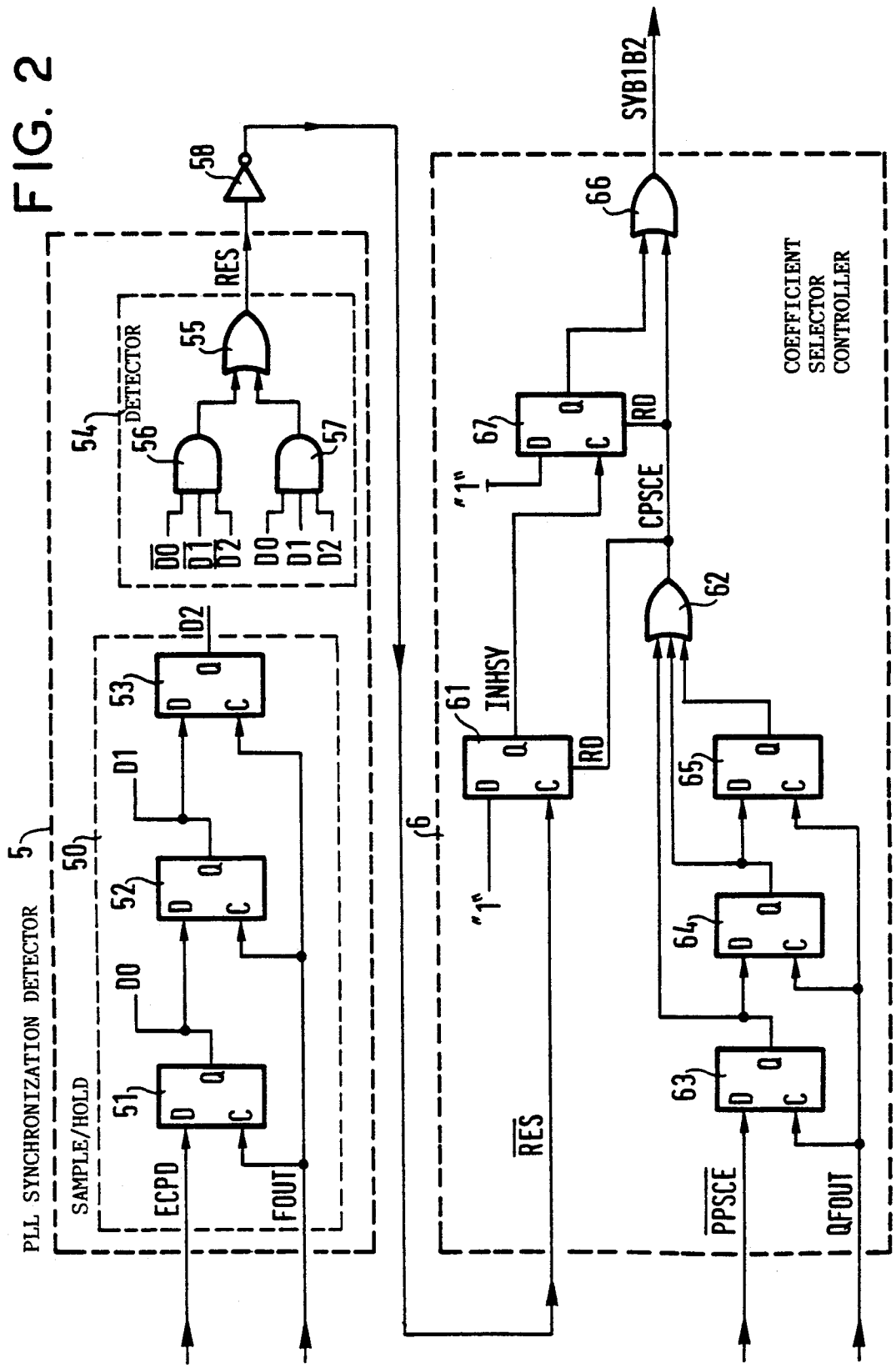
Figure 3:
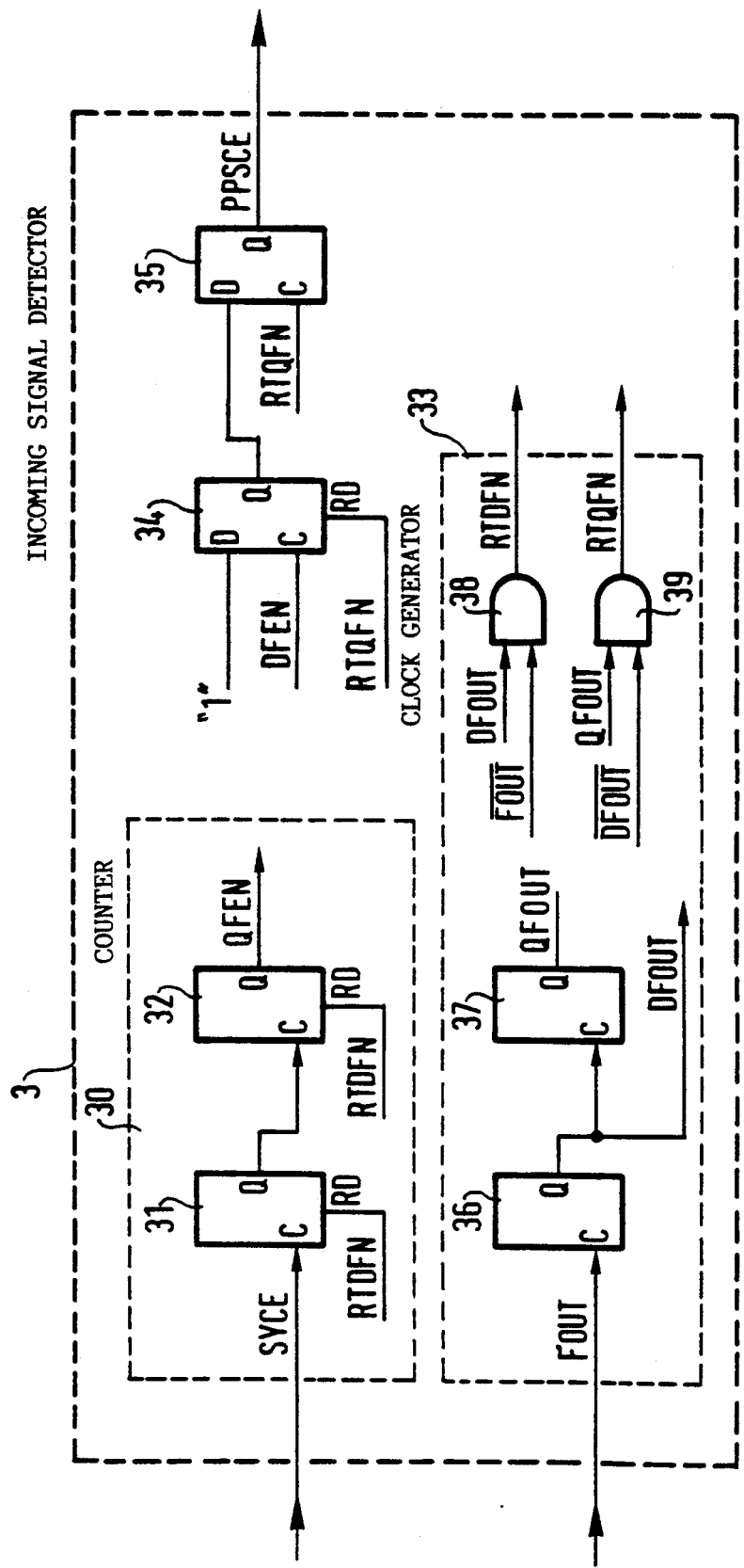
Figure 4:
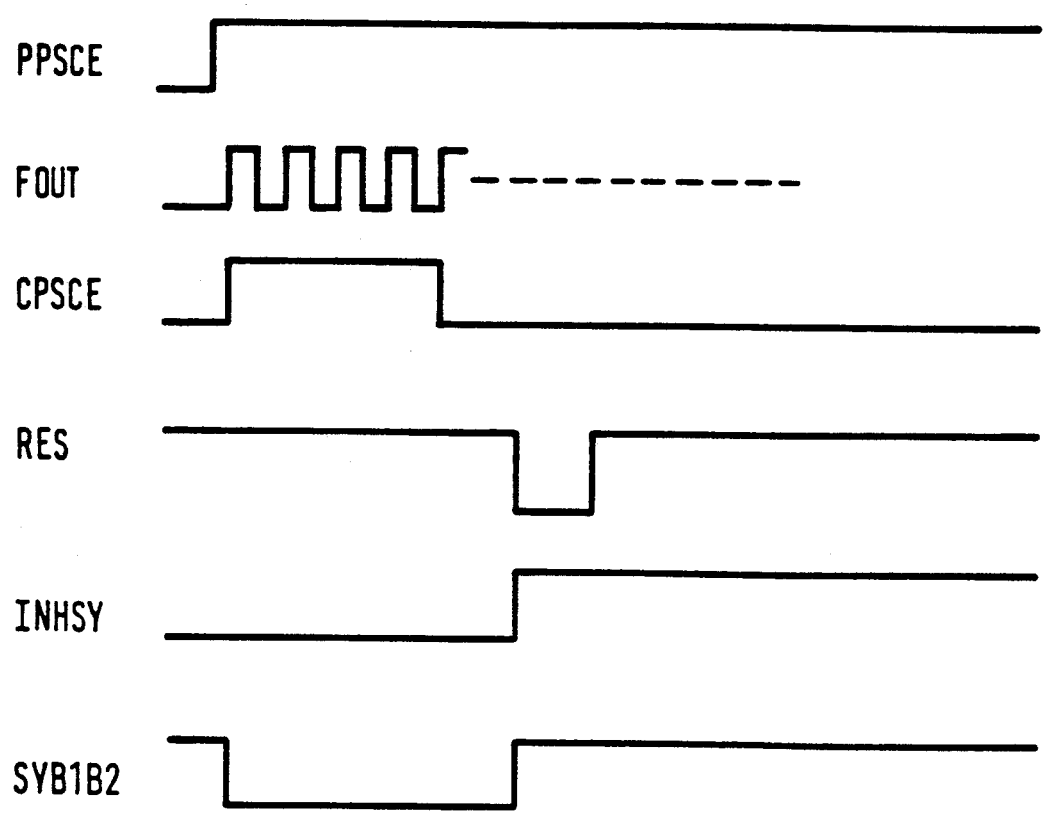

Other objects and features of the invention will emerge from the following description of one embodiment of the invention given with reference to the appended drawings in which:

FIG. 1 is a block diagram of a control device in accordance with the invention shown with the digital phase-locked loop to which it is applied, FIG. 2 is a block diagram of one possible embodiment of phase-locked loop synchronization detection and counter capacity selection control means as used in this control device, FIG. 3 is a block diagram of one possible embodiment of means for detecting the moment at which an input signal appears as used in this control device, FIG. 4 is a timing diagram illustrating said counter capacity selection control.

FIG. 1 shows a first order (for example) digital phase-locked loop 1. This phase-locked loop, whose internal arrangement is not shown in the figure, receives an input signal FIN and supplies an output signal FOUT. The loop further receives, via a coefficient selector 2, a coefficient K for controlling the capacity of its incrementation or decrementation control counter and further supplies a phase detector output signal ECPD. This phase detector is responsive to transitions in signals applied to it and in what follows it is assumed that a downward transition in the FOUT signal causes the ECPD signal to go high and that a subsequent downward transition in the FIN signal causes the ECPD signal to go low.

FIG. 1 also shows means 3 for detecting the appearance of an input signal. In the example mentioned above of synchronizing a telecommunication terminal connected to an asynchronous transfer mode telecommunication network, the input signal comprises a series of fixed-length cells or packets, the cells of the same series relating to the same call set up via the network. The series of cells are present intermittently, as calls involving the terminal in question are set up and cleared down.

The detector 3 receives a digital signal SYCE clocked at the same rate as the input cells. This signal is the input signal FIN of the phase-locked loop.

FIG. 1 also shows means 5 for detecting synchronization of the phase-locked loop 1 using the signals ECPD and FOUT in a manner that will be described later with reference to FIG. 2. Control means 6 for the coefficient selector 2 use the signal RES supplied by the detector 5 and the signals PPSCE and FOUT in a manner that will be described later with reference to FIG. 2 and produce a control signal SYB1B2 for the coefficient selector 2.

Referring to FIG. 2, the synchronization detector 5 comprises means 50 for sampling the signal ECPD using the signal FOUT and for holding (storing) a certain number of consecutive samples obtained in this way (three samples in this example, but a greater number could be held).

The sample and hold means 50 comprise in this instance three D type flip-flops 51, 52, 53 whose clock input C receives the signal FOUT. The "D" input of the flip-flop 51 receives the signal ECPD. The "D" input of the flip-flop 52 receives the signal D0 supplied by the "Q" output of the flip-flop 51. The "D" input of the flip-flop 53 receives the signal D1 supplied by the "Q" output of the flip-flop 52. The "Q" output of the flip-flop 53 supplies a signal D2.

The synchronization detector 5 further comprises a circuit 54 for detecting non-identical values of two of the samples held in the sample and hold means 50.

The circuit 54 comprises in this instance an "OR" gate 55 a first input of which receives the output signal of an "AND" gate 56 receiving the inverted signals D0, D1, and D2 (denoted $\overline{D0}$, $\overline{D1}$, $\overline{D2}$) and a second input of which receives the output signal of an "AND" gate 57 receiving the signals D0, D1 and D2.

The output signal of the "OR" gate 55 constitutes the output signal RES of the synchronization detector.

The invention relies on the fact that the output signal ECPD of a phase detector responding to transitions in the signals applied to it produces two such samples of opposite logical value bracketing an "ideal" synchronization time which cannot be achieved in practise because the loop operates by incrementing or decrementing the frequency, that is to say by discontinuous rather than continuous variation of this frequency.

The synchronization time detected by the sample and hold means 50 is that when two of the three held samples are of opposite logical value for the first time.

In practise the signal ECPD meets this condition relatively frequently after synchronization is achieved and relatively infrequently before synchronization is achieved. For this reason the signal RES is not processed as such by the coefficient selector from FIG. 1 but rather after processing in the manner now to be described in a circuit 6.

A signal INHSY is produced by means of a "D" type flip-flop 61 which receives on its "D" input a logic value "1" and on its clock input a signal $\overline{RES}$ obtained by inverting the signal RES by means of an inverter 58.

The flip-flop 61 receives on its reset input RD a signal CPSCE produced as follows.

This signal CPSCE is obtained at the output of an "OR" gate 62 with three inputs respectively connected to the Q output of three flip-flops 63, 64, 65 connected in cascade, that is to say with the "Q" output of the first flip-flop 63 connected to "D" input of the second flip-flop 63 and the "Q" output of this second flip-flop connected to the "D" input of the third flip-flop 65.

The "D" input of the first flip-flop 63 receives the inverted signal PPSCE (denoted $\overline{PPSCE}$) and the clock input of each of these three flip-flops receives a signal QFOUT whose frequency is one quarter that of the signal FOUT.

Because of the signal INHSY the first transition in the signal RES, representing synchronization, acted on is that which occurs for the first time after a certain time period starting from detection of the appearance of the input signal, this time period being equal in this instance to four periods of the signal FOUT.

The coefficient selection control signal SYB1B2 is obtained at the output of an "OR" gate 66 having two inputs which respectively receive the signal CPSCE and the signal supplied by the Q output of a D type flip-flop 67 whose D input receives a logic value "1", whose clock input receives the signal INHSY and whose reset input receives the signal CPSCE.

Thus between detection of the appearance of the input signal and detection of synchronization the signal SYB1B2 has a first logic value conditioning the selection of a first coefficient value representing a relatively low counter capacity in order to reduce the synchronization time. After synchronization is detected, or in the absence of the input signal FIN, the signal SYB1B2 has a second logic value conditioning the selection of a second coefficient value representing a relatively high counter capacity in order to filter effectively the phase variations of the input signal FIN.

FIG. 4 is a timing diagram illustrating this counter capacity selection mode. The first line of this timing diagram shows the signal PPSCE whose transition from the logic value 0 to the logic value 1 indicates detection of the appearance of the input signal.

The second line of this timing diagram shows the signal FOUT.

The third line of this timing diagram shows the signal CPSCE which assumes a logic value 1 on the first transition in the signal FOUT after the transition in the signal PPSCE and which in this example retains this logic value 1 for four consecutive periods of the signal FOUT.

The fourth line of this timing diagram shows the signal RES which includes a downward transition representing synchronization of the phase-locked loop. This downward transition is in practise followed by an upward transition, as shown in the timing diagram.

The fifth line of this timing diagram shows the signal INHSY which goes from the logic value 0 to the logic value 1 on this downward transition of the signal RES and which then retains this logic value 1 for as long as the signal CPSCE retains the logic value 0.

The last line of this timing diagram shows the coefficient selection control signal SYB1B2 for which the truth table is as follows:

| CPSCE | INHSY | SYB1B2 |
| --- | --- | --- |
| 1 | 0 | 1 |
| 0 | 0 | 0 |
| 0 | 1 | 1 |

The means 3 for detecting the appearance of the input signal shown in FIG. 3 essentially divide the input signal SYCE by a factor n in order to count n consecutive input cells and by acting on the result of this counting at a rate derived in this instance from the output signal FOUT and obtained by dividing this signal FOUT by the same factor n.

In the example shown in FIG. 3 n=4. The detector 3 comprises a counter 30 which divides by n in the form of two cascaded flip-flops 31 and 32, in other words with the Q output of the first flip-flop 31 connected to the clock input of the second flip-flop 32. The clock input of the flip-flop 31 further receives the input timing signal SYCE and the output signal of the flip-flop 32 is denoted QFEN. The two flip-flops 31 and 32 are respectively reset by a signal RTDFN and by a signal RTQFN produced by a generator 33 deriving clock signals from the signal FOUT.

The signal QFEN from the counter 30 is applied to the clock input of a D type flip-flop 34 whose D input is at logic 1.

The Q output of the flip-flop 34 is connected to the D input of a flip-flop 35 whose clock input receives a signal RTQFN from the generator 33. The Q output of the flip-flop 35 supplies the signal PPSCE indicating the appearance of the input signal.

The flip-flop 34 also receives at its reset input the signal RTQFN from the generator 33.

In this example the generator 33 comprises a frequency counter which divides by four comprising two flip-flops 36 and 37 in cascade, in a similar manner to the flip-flops 31 and 32. The flip-flop 36 further receives at its clock input the signal FOUT and supplies at its Q output a signal DFOUT. The flip-flop 37 supplies at its Q output a signal QFOUT.

The generator 33 further comprises an AND gate 38 which receives the signal DFOUT and the inverted signal FOUT (denoted $\overline{FOUT}$) and which supplies the signal RTDFN.

The generator 33 further comprises an AND gate 39 which receives the signal QFOUT and the inverted signal DFOUT (denoted $\overline{DFOUT}$) and which supplies the signal RTQFN.

I claim:

1. Method for controlling the operating mode of a digital phase-locked loop comprising a counter controlling incrementing or decrementing of the frequency of a digital clock signal internal to said loop characterized in that, the input signal of said loop being present intermittently, with random phase from one appearance to the next, the control method comprises, in this order, the following steps:

detecting the appearance of said input signal, selecting a relatively low capacity of said counter to enable relatively fast synchronization of said loop, detecting synchronization of said loop, selecting a relatively high capacity of said counter to filter relatively strongly any phase variations of said input signal occurring while it is present, this latter adjustment being retained until the next detection of the appearance of the input signal.

2. Device for implementing the method according to claim 1 characterized in that, said phase-locked loop (1) comprising a detector responsive to the phase difference between said input signal and said output signal and the output signal of said phase difference detector having transitions of a first type coincident with transitions of a given type in the output signal and transitions of a second type coincident with transitions of a given type in the input signal, said device comprises means (5) for detecting said synchronization comprising means for sampling the output signal of the phase difference detector on transitions of the output signal which are of the type opposite to said given type, means (50) for holding groups of at least three consecutive samples, and means (54) for detecting the moment at which at least two of said samples have different logical values for the first time.

3. Device for implementing the method according to claim 1 characterized in that it comprises, for selecting said counter capacity, a binary signal (SYB1B2) generator comprising:

a D type flip-flop (67) whose D input has the logical value 1, whose clock input receives a signal from synchronization detector means (5) and whose reset input receives via time-delay means a signal from means (3) for detecting the appearance of the input signal, an OR logic gate 66 which receives the signal supplied by the Q output of said flip-flop and the signal applied to the reset input of said flip-flop and which supplies said binary signal (SYB1B2).

* * * * *